(12) United States Patent
Bao et al.

(10) Patent No.: US 10,804,368 B2
(45) Date of Patent: Oct. 13, 2020

(54) SEMICONDUCTOR DEVICE HAVING TWO-PART SPACER

(71) Applicant: International Business Machines Corporation, Armonk, NY (US)

(72) Inventors: Ruqiang Bao, Niskayuna, NY (US); Junli Wang, Slingerlands, NY (US); Dechao Guo, Niskayuna, NY (US); Heng Wu, Guilderland, NY (US); Ernest Y. Wu, Essex Junction, VT (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/049,403

(22) Filed: Jul. 30, 2018

(65) Prior Publication Data

US 2020/0035808 A1  Jan. 30, 2020

(51) Int. Cl.
*H01L 29/51* (2006.01)
*H01L 29/78* (2006.01)
*H01L 29/66* (2006.01)
*H01L 29/417* (2006.01)

(52) U.S. Cl.
CPC ...... *H01L 29/518* (2013.01); *H01L 29/41791* (2013.01); *H01L 29/6656* (2013.01); *H01L 29/66795* (2013.01); *H01L 29/785* (2013.01)

(58) Field of Classification Search
CPC .......... H01L 29/66545; H01L 29/7827; H01L 29/66666; H01L 29/785; H01L 29/6656; H01L 29/66975; H01L 29/42392; H01L 29/518; H01L 29/41791; H01L 21/823481; H01L 29/66553; H01L 29/7848; H01L 21/823431; H01L 21/823821; H01L 29/6653; H01L 27/0886; H01L 27/0924
See application file for complete search history.

(56) References Cited

U.S. PATENT DOCUMENTS

| | | | |
|---|---|---|---|
| 8,969,934 B1 | 3/2015 | Cheng et al. | |
| 9,275,995 B2 | 3/2016 | Kim et al. | |
| 9,324,576 B2 | 4/2016 | Zhang et al. | |
| 9,324,796 B2 | 4/2016 | Cheng et al. | |
| 9,425,319 B2 | 8/2016 | Cai et al. | |
| 9,530,866 B1 * | 12/2016 | Zhang | H01L 29/66666 |
| 9,640,667 B1 | 5/2017 | Balakrishnan et al. | |
| 9,647,112 B1 * | 5/2017 | Balakrishnan | H01L 29/7845 |
| 9,673,293 B1 | 6/2017 | Cheng et al. | |

(Continued)

*Primary Examiner* — Khiem D Nguyen
(74) *Attorney, Agent, or Firm* — Amin, Turocy & Watson, LLP

(57) ABSTRACT

Techniques for fabricating a semiconductor device having a two-part spacer. In one embodiment, a device is provided that comprises a spacer having a first portion and a second portion, where the first portion comprises one or more layers and the second portion comprises a dielectric material. In one or more implementations, the device further comprises an isolation layer coupled to the spacer, where the isolation layer comprises a silicon oxide material. In one or implementation, the device can further comprise a gate structure formed on a substrate, where the gate structure comprises a polysilicon contact portion, a first silicon dioxide portion, a silicon nitride portion and a second silicon dioxide portion.

20 Claims, 16 Drawing Sheets

(56) References Cited

U.S. PATENT DOCUMENTS

| | | | |
|---|---|---|---|
| 9,865,595 B1 | 1/2018 | Yu et al. | |
| 9,865,738 B2 | 1/2018 | Kim | |
| 9,947,804 B1* | 4/2018 | Frougier | H01L 29/78696 |
| 10,319,833 B1* | 6/2019 | Jagannathan | H01L 29/66553 |
| 2006/0187709 A1* | 8/2006 | Ogura | G11C 16/0466 |
| | | | 365/185.03 |
| 2013/0099313 A1* | 4/2013 | Cartier | H01L 29/6656 |
| | | | 257/347 |
| 2015/0024568 A1 | 1/2015 | Mehta et al. | |
| 2015/0303118 A1 | 10/2015 | Wang et al. | |
| 2016/0020305 A1* | 1/2016 | Obradovic | H01L 29/7391 |
| | | | 257/39 |
| 2016/0240650 A1* | 8/2016 | Chang | H01L 29/42372 |
| 2017/0077247 A1* | 3/2017 | Xie | H01L 29/78 |
| 2017/0084612 A1* | 3/2017 | Basker | H01L 21/3212 |
| 2017/0309630 A1* | 10/2017 | Cheng | H01L 27/0924 |
| 2017/0373063 A1* | 12/2017 | Bao | H01L 27/0924 |
| 2018/0090582 A1 | 3/2018 | Adusumilli et al. | |
| 2018/0301341 A1* | 10/2018 | Coquand | H01L 29/66742 |

\* cited by examiner

FIG. 7A  FIG. 7B

SEMICONDUCTOR DEVICE HAVING TWO-PART SPACER

BACKGROUND

The subject disclosure relates generally to semiconductor device and, more particularly, a semiconductor device having a two-part spacer.

SUMMARY

The following presents a summary to provide a basic understanding of one or more embodiments of the invention. This summary is not intended to identify key or critical elements, delineate scope of the embodiments or scope of the claims. Its sole purpose is to present concepts in a simplified form as a prelude to the more detailed description that is presented later. In one or more embodiments is described herein, systems, methods, apparatus and/or computer program products that facilitate a gate device having reduced contact resistance are described.

According to an embodiment, a device comprises a spacer having a first portion and a second portion, where the first portion comprises one or more layers and the second portion comprises a dielectric material. In one or more implementations, the device further comprises an isolation layer coupled to the spacer, where the isolation layer comprises a silicon oxide material.

In some examples, the device can further comprise a gate structure formed on a substrate, where the gate structure comprises a polysilicon contact portion, a first silicon dioxide portion, a silicon nitride portion and a second silicon dioxide portion.

In another embodiment, a method is provided that comprises forming a spacer having a first portion and a second portion, where the first portion comprises one or more layers and the second portion comprises a dielectric material. The method can further comprise forming an isolation layer coupled to the spacer, where the isolation layer comprises a silicon oxide material.

In some examples, the method can further comprise forming a gate structure on a substrate, where the gate structure comprises a polysilicon contact portion, a first silicon dioxide portion, a silicon nitride portion and a second silicon dioxide portion.

In another embodiment, a method is provided that comprises forming a gate structure on a substrate. The method further comprises forming a source structure on the substrate that passes through a channel portion of the gate structure. The method further comprises forming a spacer comprises a first portion and a second portion, where the first portion comprises one or more layers and the second portion comprises a dielectric material.

In some examples, the method can further comprise forming an isolation layer coupled to the spacer, where the isolation layer comprises a silicon oxide material and where the first portion of the spacer comprises a first layer that comprises a silicon nitride material and a second layer that comprises a silicon boron carbon nitride material

DESCRIPTION OF THE DRAWINGS

The patent or application file contains at least one drawing executed in color. Copies of this patent or patent application publication with color drawing(s) will be provided by the Office upon request and payment of the necessary fee.

DETAILED DESCRIPTION

The following detailed description is merely illustrative and is not intended to limit embodiments and/or applications or uses of embodiments. Furthermore, there is no intention to be bound by any expressed or implied information presented in the preceding Summary section, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident; however, in various cases, that the one or more embodiments can be practiced without these specific details.

The terminology used herein is for describing particular embodiments only and is not intended to be limiting of the inventive concept. As used herein, the singular forms "a," "an," and "the" are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof. It is to be understood that when an element is referred to as being "connected" or "coupled" to another element, it may be directly connected or coupled to the other element or intervening elements may be present. In contrast, when an element is referred to as being "directly connected" or "directly coupled" to another element, there are no other intervening elements present.

Spatially relative terms, such as "beneath," "below," "around," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below.

Figure 1:
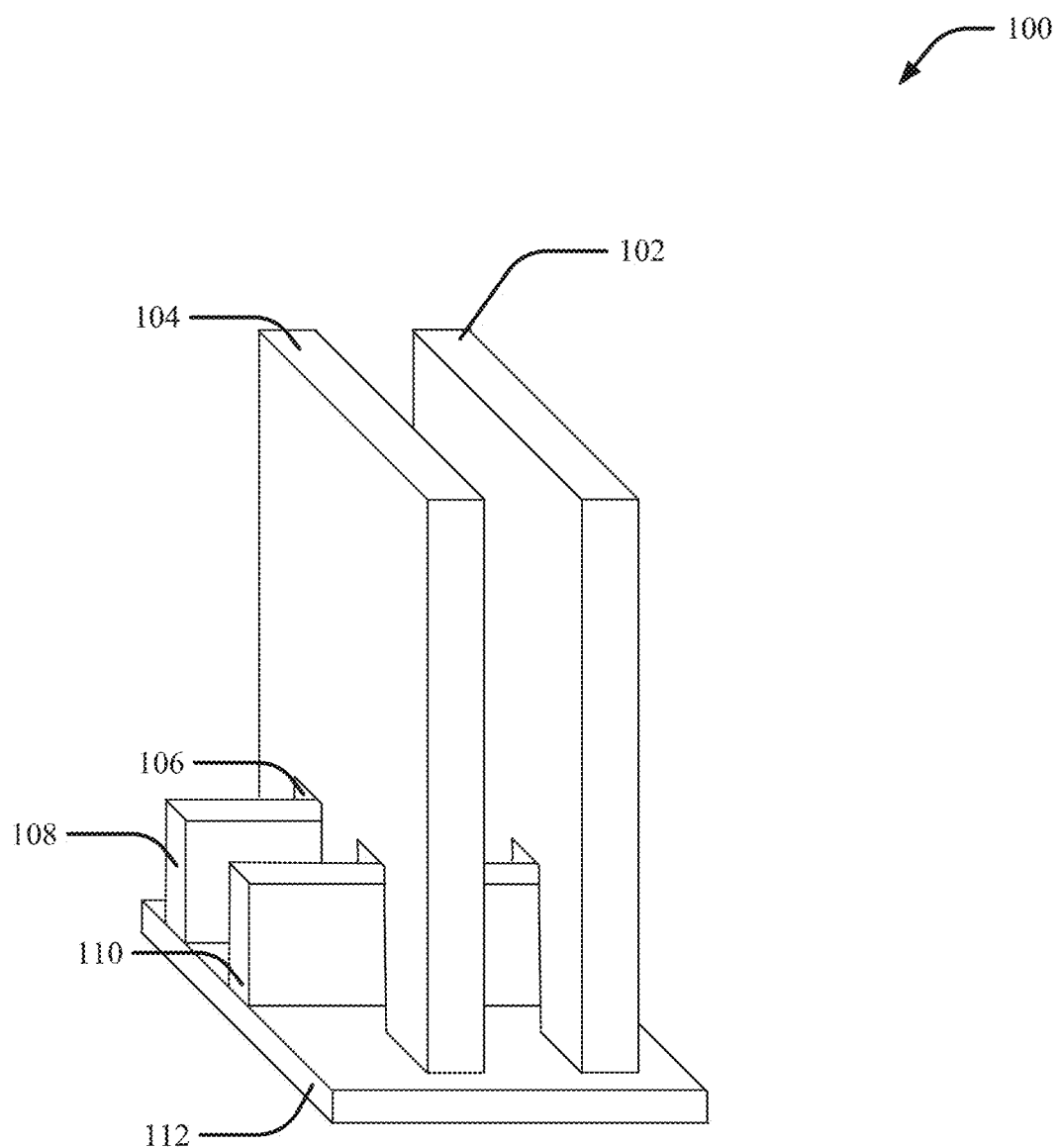
FIG. 1 illustrates an example, a non-limiting semiconductor device in accordance with one or more embodiments is described herein FIG. 2A illustrate example, non-limiting cross-sectional views of a step in fabricating a semiconductor device with a two-part spacer in accordance with one or more embodiments is described herein.

FIG. 1 illustrates an example, a non-limiting semiconductor device 100 in accordance with one or more embodiments is described herein. As depicted, a perspective view of a semiconductor device 100 comprises gate structures 102 and 104, each having a channel portion 106, source structures 108 and 110 (may also be referenced as drain structures) and a substrate 112. In some embodiments, the gates structures 102 and 104 are formed on the substrate 112. The source structures 108 and 110 orthogonally pass through the channel portion 106 of the gate structures 102 and 104, respectively. The source structures 108 and 110 are formed on the substrate 112. In some embodiments the source structures 108 and 110 may be fin field effect transistors. A fin field effect transistor (FinFET) is a type of transistor used in design of processors. There are two types of FinFET, N-type and P-type. In other embodiments, the source structures 108 and 110 may be transistors made from a plurality of nanosheets. Multiple nanosheets are stacked on top of each other to make a transistor. It is to be appreciated that any suitable type of semiconductor device for carrying out functionality described and claimed herein can be employed.

FIGS. 2A-13A and 2B-13B illustrate cross-sectional views of semiconductor device 100 and methods for fabricating the semiconductor device 100 with two-part spacer during various stages of its fabrication in accordance with an exemplary embodiment. For sake of brevity, only two gate structures and one source structure are shown. One skilled in the art may apply the method to fabricate a semiconductor device having plurality of gate structures and plurality of source structures.

Figures 2A, 2B:
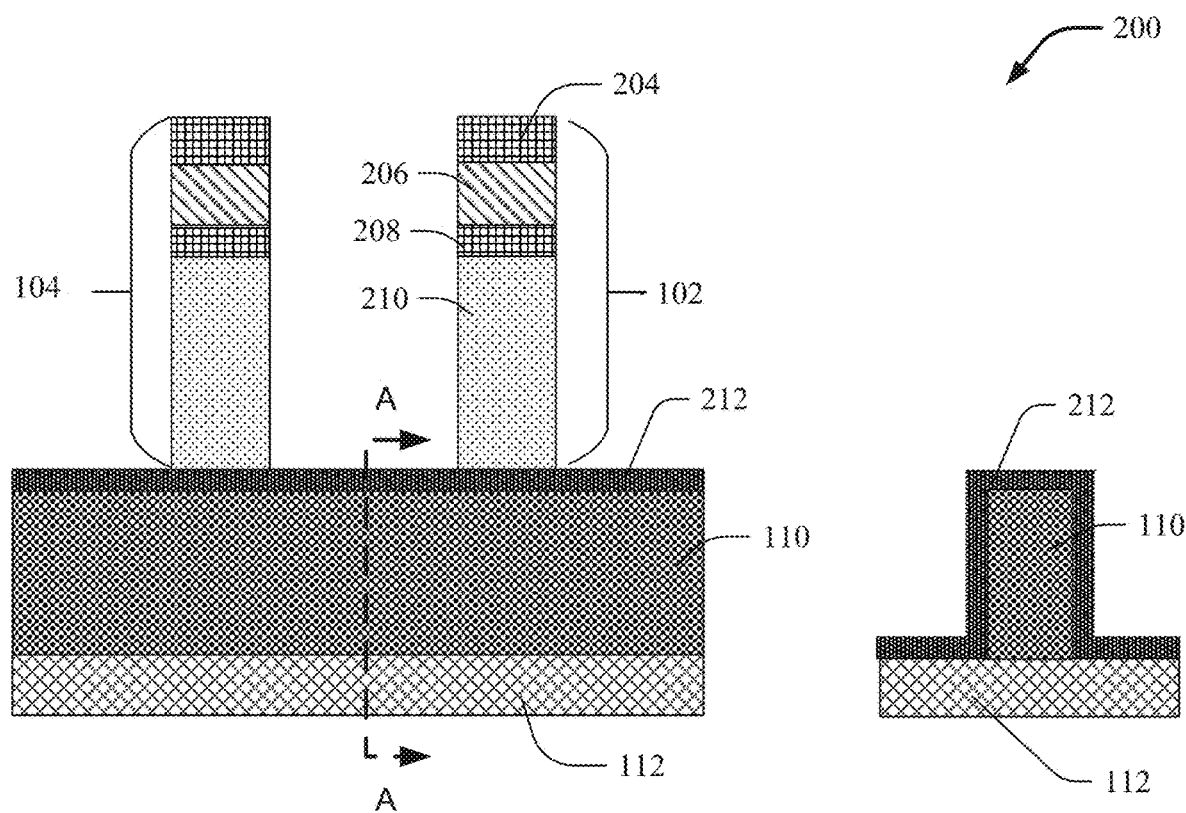
FIG. 2B illustrate example, non-limiting cross-sectional views of a step in fabricating a semiconductor device with a two-part spacer in accordance with one or more embodiments is described herein.

In connection with FIGS. 2A and 2B, a cross-sectional view of a step in fabricating a semiconductor device 200 with two-part spacer in accordance with one or more embodiments is depicted and described herein. Repetitive description of like elements employed in respective embodiments is omitted for sake of brevity. According to one or more embodiments, an isolation layer 212 is formed around the source structure 110 and on the substrate 112. In one example, the isolation layer 212 is formed by deposition of silicon oxide (SiOx) material.

In one embodiment, the gate structures 102 and 104 (e.g., dummy gates or polysilicon contacts (PC)) extend vertically from the substrate 112. Each gate structure comprises a polysilicon contact portion 210, a first silicon dioxide portion 208, a silicon nitride portion 206 and a second silicon dioxide portion 204. In other embodiments, each gate structures comprises amorphous silicon, poly silicon, silicon dioxide and silicon nitride.

In one or more embodiments, the substrate 112 is made using a dielectric material, for example silicon (Si). Other suitable materials may also be used for the substrate 112, for example silicon dioxide (SiO2), silicon germanium (SiGe), silicon carbide, gallium arsenide, silicon germanium carbide, or combination thereof.

Figures 3A, 3B:
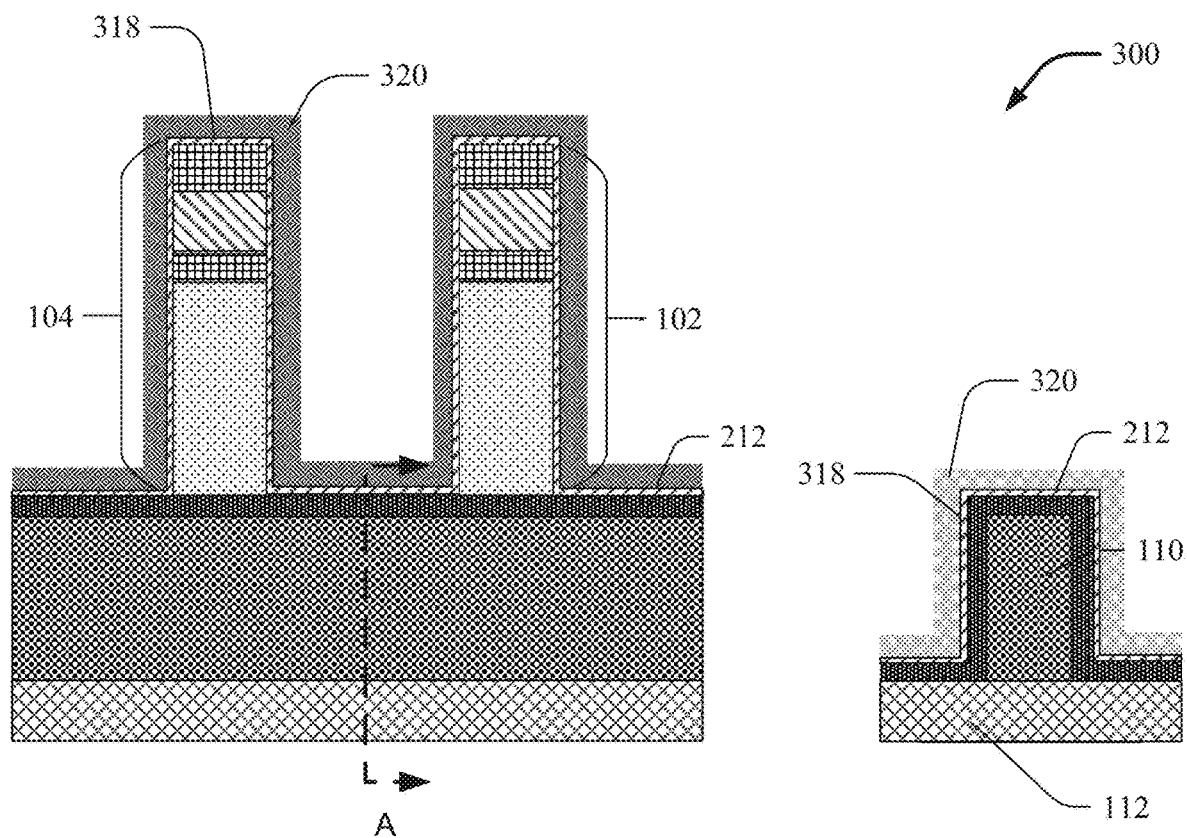
FIG. 3A illustrate example, non-limiting cross-sectional views of a step in fabricating a semiconductor device with a two-part spacer in accordance with one or more embodiments is described herein.
FIG. 3B illustrate example, non-limiting cross-sectional views of a step in fabricating a semiconductor device with a two-part spacer in accordance with one or more embodiments is described herein.

Referring now to FIGS. 3A and 3B, a cross-sectional view of a step in fabricating a semiconductor device 300 with two-part spacer in accordance with one or more embodiments is described herein. Repetitive description of like elements employed in respective embodiments is omitted for sake of brevity. According to one or more embodiments, an etch stop layer 318 is formed on the isolation layer 212 and around the gate structures 102 and 104. A first spacer layer 320 is formed by deposition of first spacer material over the etch stop layer 318. The etch stop layer 318 acts as both a glue layer for ensuring adhesion between the first spacer layer 320 and the underlying isolation layer 212, and as an etch stop layer used during the formation of a contact opening. In one example, the etch stop layer 318 is made of oxide material. Other example materials for the etch stop layer 318 include aluminum oxide (AlOx), silicon oxycarbide (SiOC), silicon carbide, silicon nitride (SiN), silicon oxynitride (SiON) or titanium nitride.

In one or more embodiments, the first spacer material comprises dielectric material with low dielectric constant value (e.g., low K, wherein K is between 4-6). In some embodiments, the spacer material may contain silicon boron carbon nitride (SiBCN), silicon dioxide (SiO2), silicon nitride (SiN) or silicon oxynitride (SiON).

Figures 4A, 4B:
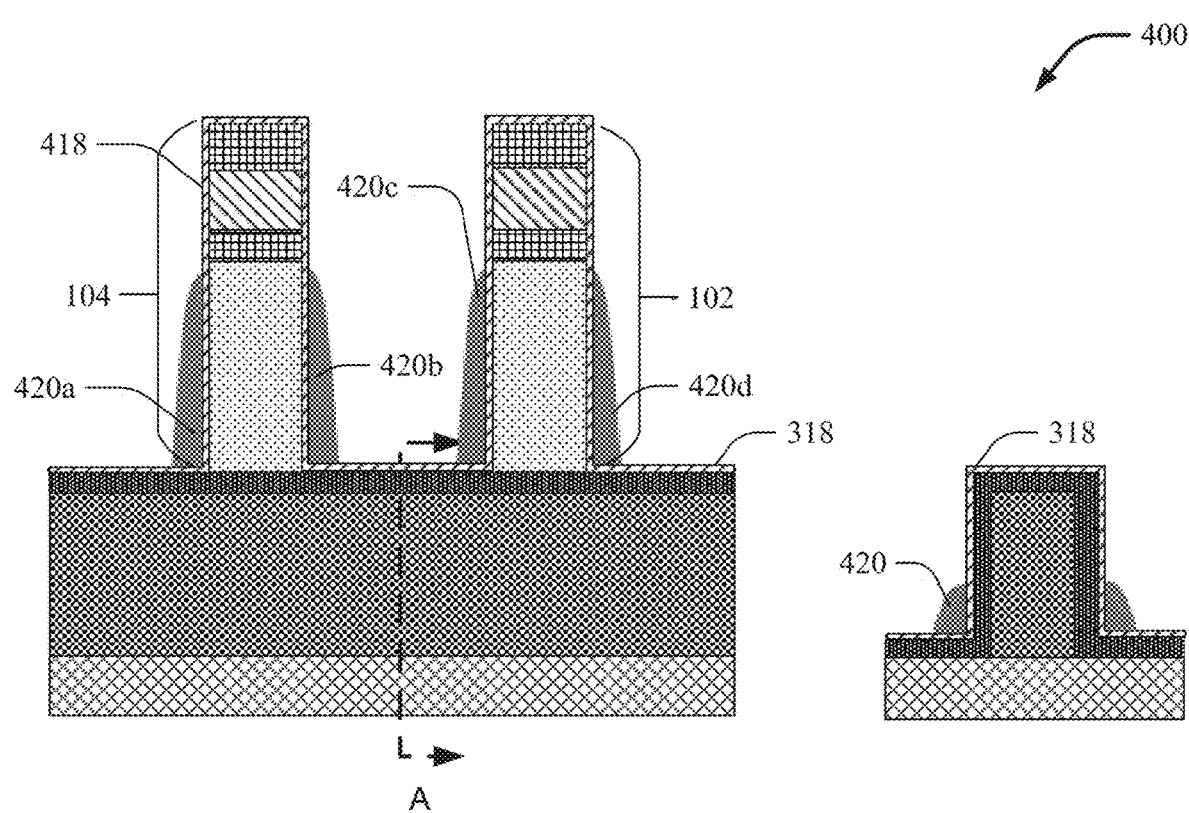
FIG. 4A illustrate example, non-limiting cross-sectional views of a step in fabricating a semiconductor device with a two-part spacer in accordance with one or more embodiments is described herein.
FIG. 4B illustrate example, non-limiting cross-sectional views of a step in fabricating a semiconductor device with a two-part spacer in accordance with one or more embodiments is described herein.

Referring now to FIGS. 4A and 4B, a cross-sectional view of a step in fabricating a semiconductor device 300 with two-part spacer in accordance with one or more embodiments is described herein. Repetitive description and label of like elements employed in respective embodiments are omitted for sake of brevity. According to one or more embodiments, an aggressive pull-down process is performed to create plurality of bottom portion spacers 420a-d. The first spacer layer 320 (FIGS. 3A and 3B) is etched away using conventional etching processing to remove a substantial portion of the first spacer material. In one or more embodiments, the first spacer layer 320 may be removed by selective etching processes, including wet etch operations (e.g., hot phosphoric acid), reactive ion etching (RIE), dry etch operations, or various other etching operations. Removal of the first spacer material exposes portions of the gate structures 102 and 104. In addition, a substantial portion of the etch stop layer 318 is exposed by removed of the first spacer material. Also, removal of the first spatial layer 320 causes formation of the bottom spacers 420a-d. The bottom spacers 420a-d, each also referred to as second portion of two-part spacer, may be composed of dielectric material with low dielectric constant value (e.g., low K, wherein K is between 4-6), such as oxide, oxynitride, or a combination thereof. The bottom spacers 420a-d may have width ranging 2.0 to 15.0 nanometers.

Figures 5A, 5B:
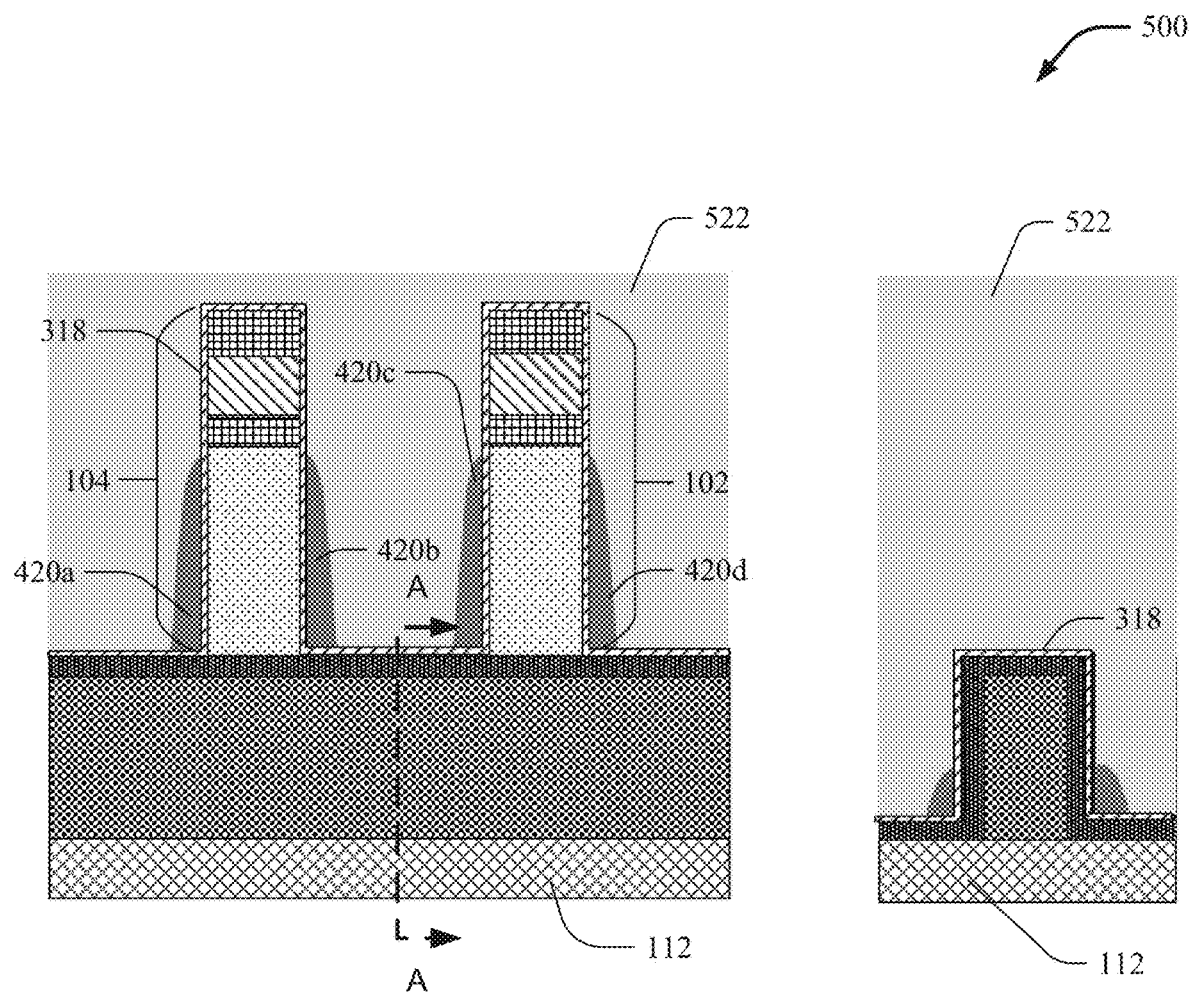
FIG. 5A illustrate example, non-limiting cross-sectional views of a step in fabricating a semiconductor device with a two-part spacer in accordance with one or more embodiments is described herein.
FIG. 5B illustrate example, non-limiting cross-sectional views of a step in fabricating a semiconductor device with a two-part spacer in accordance with one or more embodiments is described herein.

Referring now to FIGS. 5A and 5B, a cross-sectional view of a step in fabricating a semiconductor device 500 with two-part spacer in accordance with one or more embodiments is described herein. Repetitive description and label of like elements employed in respective embodiments are omitted for sake of brevity. According to one or more embodiments, a dummy layer 522 is formed over the etch stop layer 318 and the bottom portion spacers 420 a-d. The formation of the dummy layer 522 may include deposition of sacrificial material. The sacrificial material may then be planarized by chemical mechanical planarization (CMP). The sacrificial material may be amorphous silicon (a-Si), silicon (Si), epitaxy material or other suitable dielectric material. In some embodiments, the sacrificial material may be any suitable dielectric material such as silicon oxide, silicon nitride, silicon oxynitride, or silicon carbide. In some embodiments, the sacrificial material can also be organic dielectric material, or metal material, for example tungsten (W).

In an embodiment, the sacrificial material is amorphous silicon (a-Si). In some embodiments, if metal like material is used for the sacrificial material, then the etch stop layer 318 (FIG. 3) is not required. In some embodiments, if organic planarization layer is used, then the top etch layer 318 (FIG. 3) is not required.

Figures 6A, 6B:
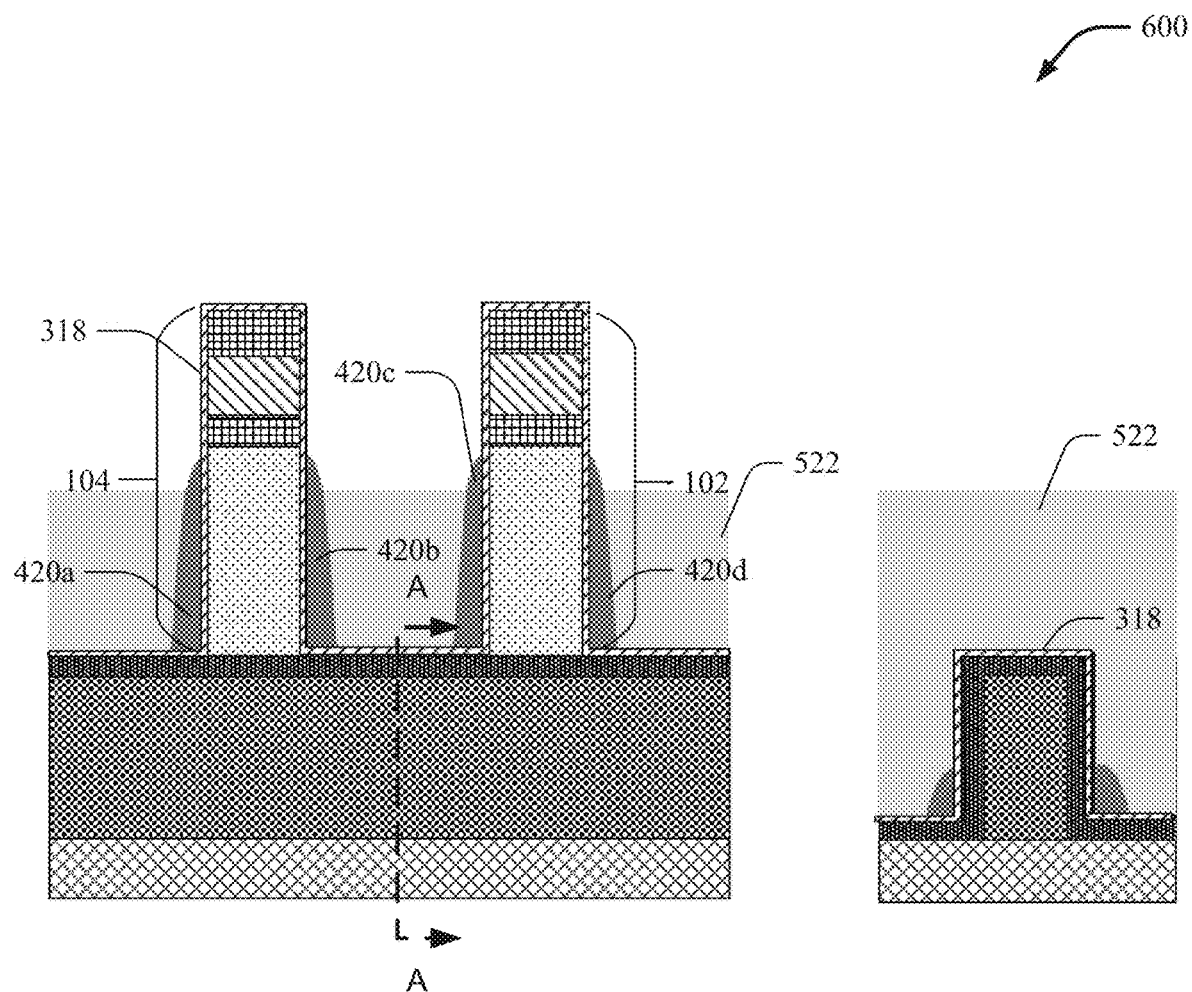
FIG. 6A illustrate example, non-limiting cross-sectional views of a step in fabricating a semiconductor device with a two-part spacer in accordance with one or more embodiments is described herein.
FIG. 6B illustrate example, non-limiting cross-sectional views of a step in fabricating a semiconductor device with a two-part spacer in accordance with one or more embodiments is described herein.
Figure 7:
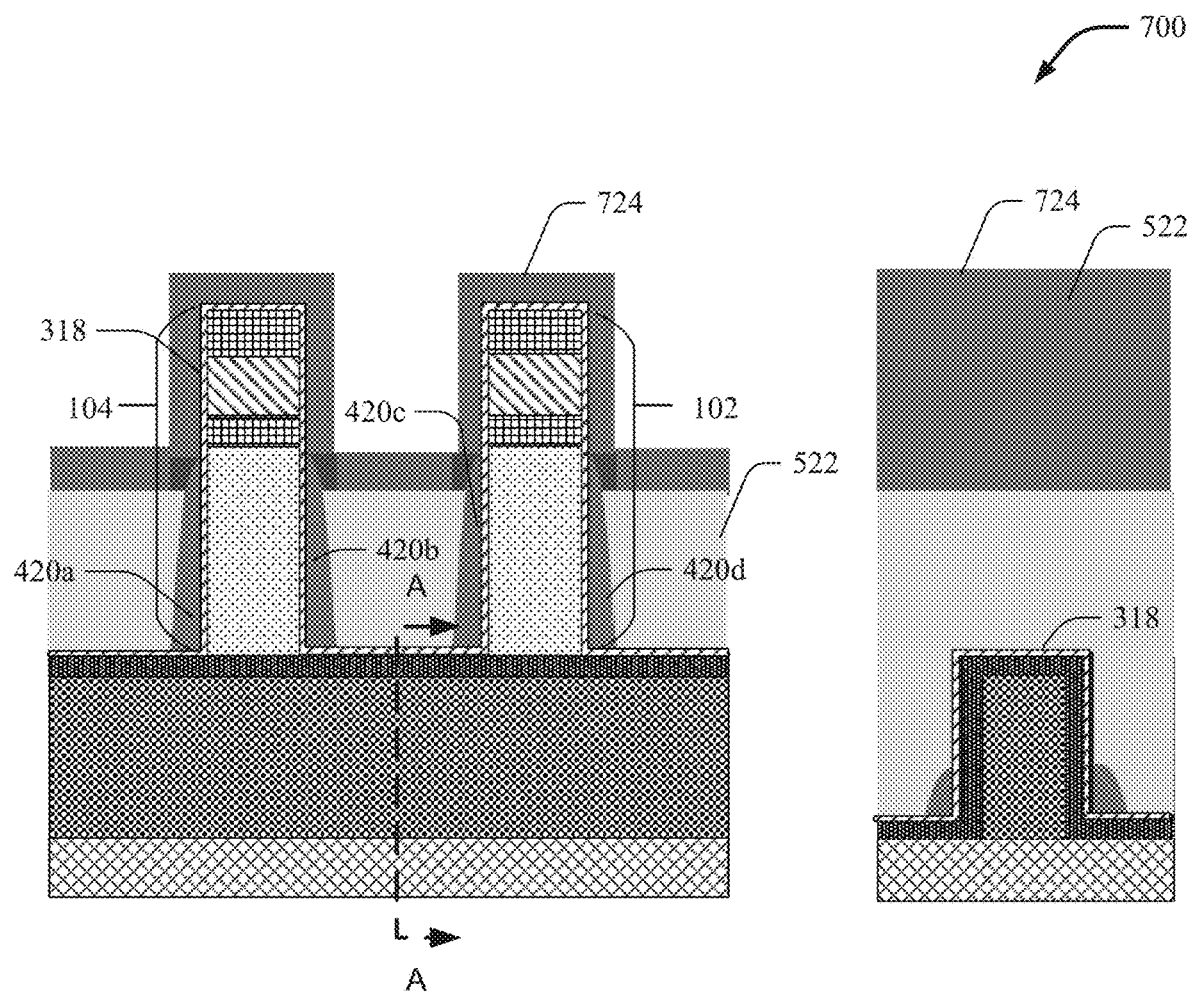
FIG. 7A illustrate example, non-limiting cross-sectional views of a step in fabricating a semiconductor device with a two-part spacer in accordance with one or more embodiments is described herein.
FIG. 7B illustrate example, non-limiting cross-sectional views of a step in fabricating a semiconductor device with a two-part spacer in accordance with one or more embodiments is described herein.

Referring now to FIGS. 6A and 6B, a cross-sectional view of a step in fabricating a semiconductor device 600 with two-part spacer in accordance with one or more embodiments is described herein. Repetitive description and label of like elements employed in respective embodiments are omitted for sake of brevity. According to one or more embodiments, the dummy layer is recessed exposing the bottom portion spacers 420a-d and exposing a portion of the gate structures 102 and 104. In some embodiments, the dummy layer is recessed such that a portion of the bottom portion spacers 420 a-d are exposed. The dummy layer is recessed using a reactive ion etching technique to remove the sacrificial material.

Referring now to FIGS. 7A and 7B, a cross-sectional view of a step in fabricating a semiconductor device 700 with two-part spacer in accordance with one or more embodiments is described herein. Repetitive description and label of like elements employed in respective embodiments are omitted for sake of brevity. According to one or more embodiments, a second spacer layer 724 is formed by deposition of second spacer material over the dummy layer 522 and formed around the exposed portion of gate structures 102 and 104. The second spacer material also covers the exposed portion of the bottom portion spacers 420 a-d. In some embodiments, the second spacer material comprises silicon nitride material. In an embodiment, the second spacer material may contain silicon boron carbon nitride (SiBCN), silicon dioxide (SiO2), silicon nitride (SiN) or silicon oxynitride (SiON).

Figures 8A, 8B:
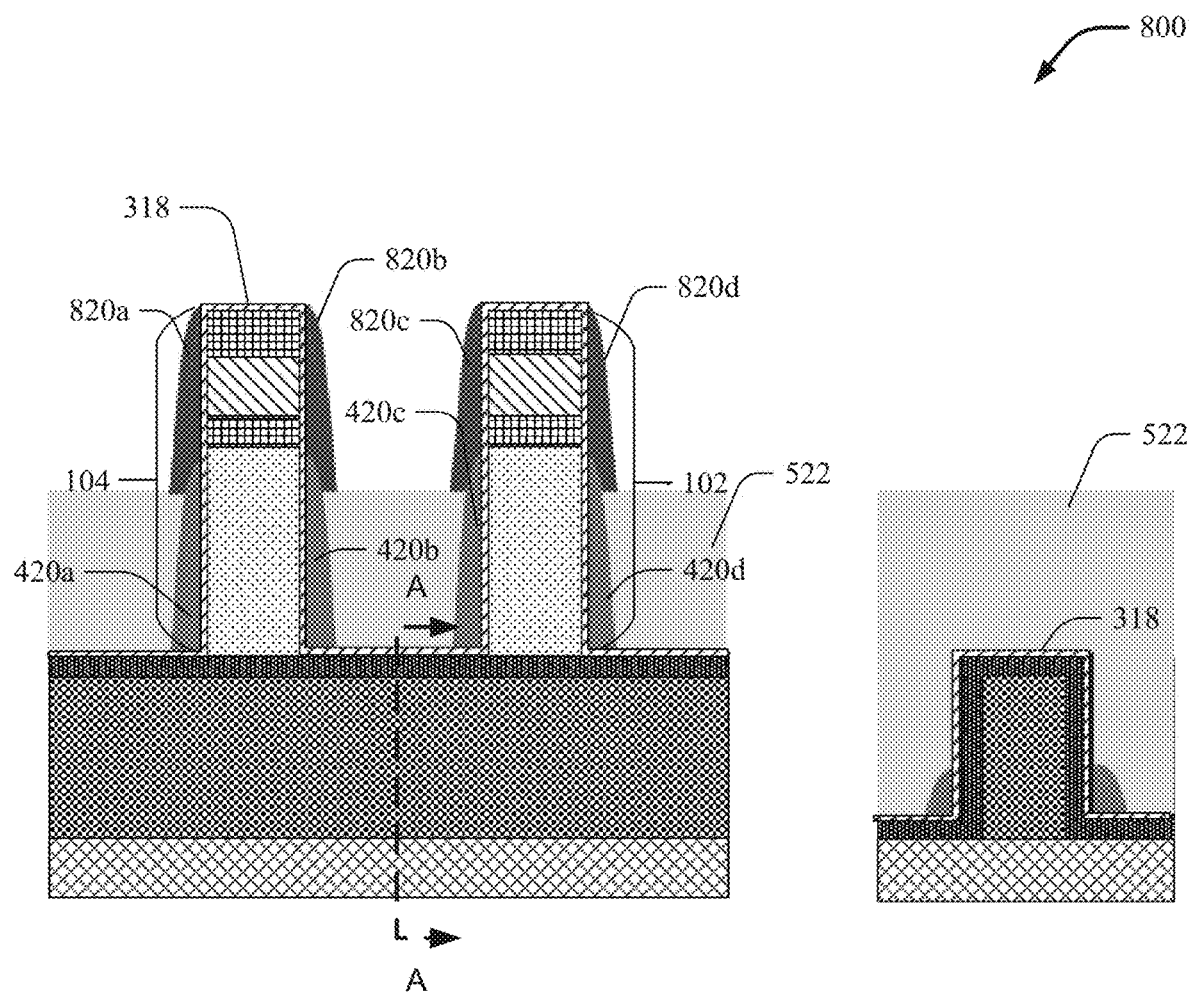
FIG. 8A illustrate example, non-limiting cross-sectional views of a step in fabricating a semiconductor device with a two-part spacer in accordance with one or more embodiments is described herein.
FIG. 8B illustrate example, non-limiting cross-sectional views of a step in fabricating a semiconductor device with a two-part spacer in accordance with one or more embodiments is described herein.

Referring now to FIGS. 8A and 8B, a cross-sectional view of a step in fabricating a semiconductor device 800 with two-part spacer in accordance with one or more embodiments is described herein. Repetitive description and label of like elements employed in respective embodiments are omitted for sake of brevity. According to one or more embodiments, the second spacer layer 724 (FIGS. 7A and 7B) is etched away using conventional etching process to remove substantial portion of the second spacer material. In one or more embodiments, the first spacer layer 320 may be removed by selective etching processes, including wet etch operations (e.g., hot phosphoric acid), reactive ion etching (RIE), dry etch operations, or various other etching operations. A plurality of top portion spacers 820a-d are formed by selectively etching substantial portion of the second spacer layer 724.

In one or more embodiments, the top portion spacers 820a-d, each also referred to as second portion of two-part spacer, extend downward from top surface of the gate structure 102 and 104 to the sacrificial material (e.g., remaining dummy layer). The top portion spacers 820a-d may be composed of one or more layers of dielectric material, such as silicon boron carbon nitride (SiBCN), silicon dioxide (SiO2), silicon nitride (SiN), silicon oxynitride (SiON) or combination thereof. In one embodiment, the top portion of the spacer comprises a first layer that comprises a first layer of silicon nitride material, a second layer that comprises a silicon boron carbon nitride material and a third layer that comprises of a second layer of silicon nitride material. As shown, the top portion spacers 820a-d are formed slightly over the bottom portion spacers 420a-d, such that sidewalls of the gate structures 102 and 104 are completely covered by combination of the bottom spacers 420a-d and the top spacers 820a-d.

Figures 9A, 9B:
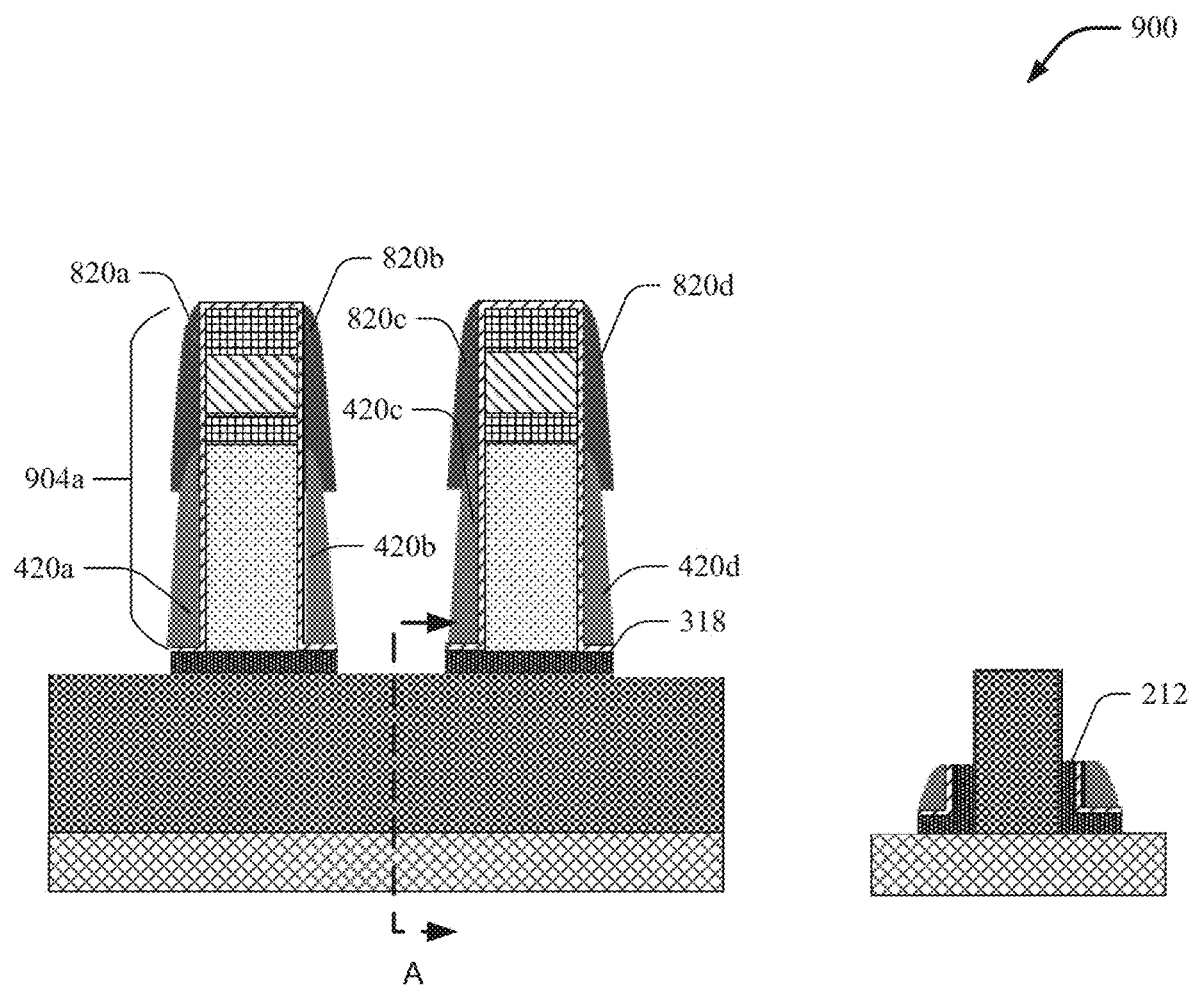
FIG. 9A illustrate example, non-limiting cross-sectional views of a step in fabricating a semiconductor device with a two-part spacer in accordance with one or more embodiments is described herein.
FIG. 9B illustrate example, non-limiting cross-sectional views of a step in fabricating a semiconductor device with a two-part spacer in accordance with one or more embodiments is described herein.

Referring now to FIGS. 9A and 9B, a cross-sectional view of a step in fabricating a semiconductor device 900 with two-part spacer in accordance with one or more embodiments is described herein. Repetitive description and label of like elements employed in respective embodiments are omitted for sake of brevity. According to one or more embodiments, the dummy layer 522 (FIGS. 8A and 8B) is etched away using a reactive ion etching process. In addition, substantial portions of the isolation layer 212 and the etch stop layer 318 are removed in preparation for forming a wrap-around contact discussed below. At this point, a two-part spacer 904 is formed by having the top portion spacer 802a deposited over the bottom portion spacer 402a. In an example, the two-part spacer 904a comprises the bottom portion spacer 420a and the top portion spacer 420b, wherein the top portion comprises one or more layers and a bottom portion comprises a dielectric material. For sake of brevity, formation of two-part spacers from combination of bottom spacers 420b-c and top portion spacers 820b-c are not labeled. An advantage of forming a two-part spacer 904a-d, which covers the gate structures 102 and 104, is that the two-part spacers 904a-d will prevent polysilicon contact portion 210 from growing when the epitaxy growth process is implemented.

Figures 10A, 10B:
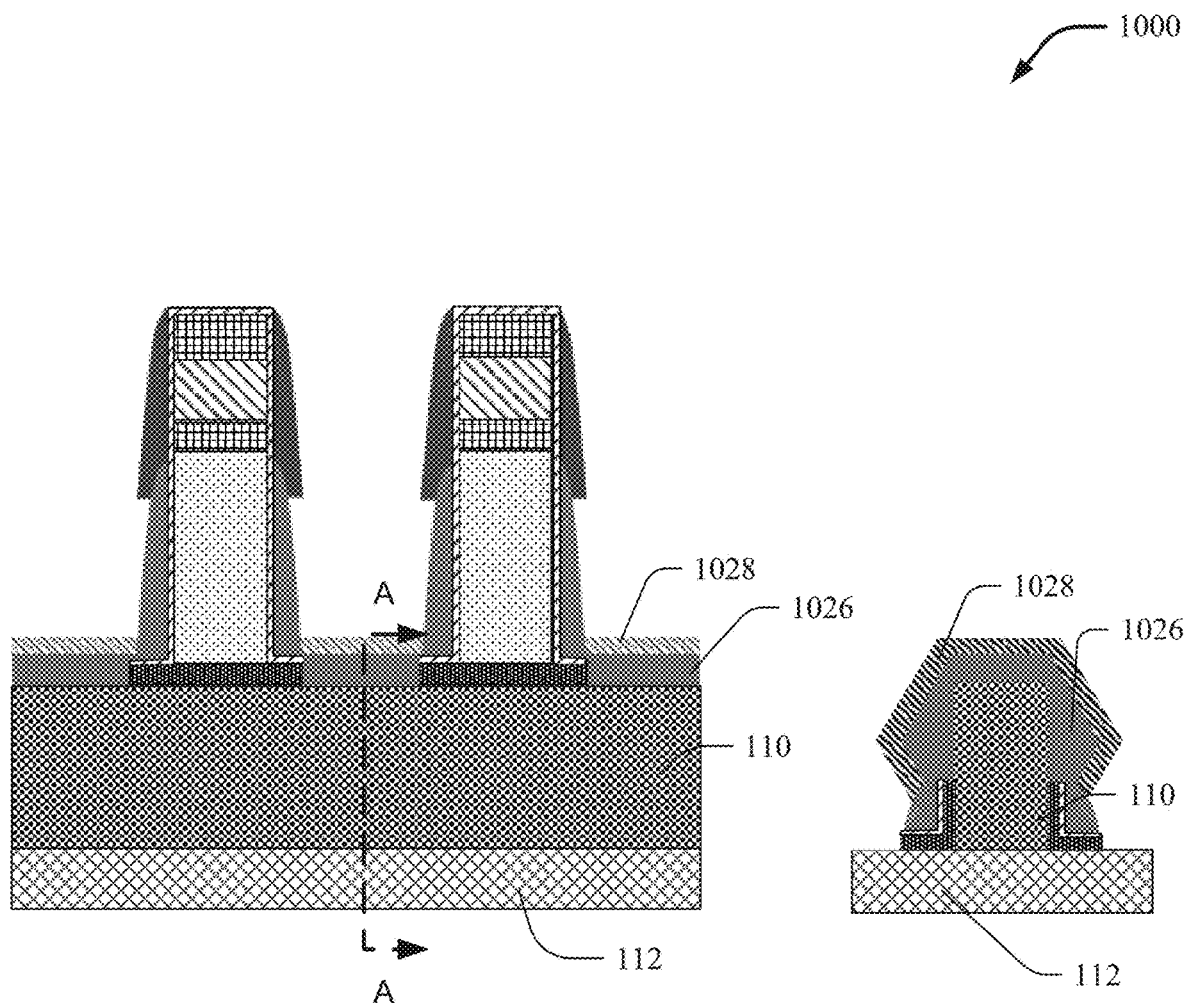
FIG. 10A illustrate example, non-limiting cross-sectional views of a step in fabricating a semiconductor device with a two-part spacer in accordance with one or more embodiments is described herein.
FIG. 10B illustrate example, non-limiting cross-sectional views of a step in fabricating a semiconductor device with a two-part spacer in accordance with one or more embodiments is described herein.

Referring now to FIGS. 10A and 10B, a cross-sectional view of a step in fabricating a semiconductor device 1000 with two-part spacer in accordance with one or more embodiments is described herein. Repetitive description and label of like elements employed in respective embodiments are omitted for sake of brevity. According to one or more embodiments, an epitaxy layer 1026 is grown around the source structures 108 and 110 (only cross section of source structure 110 is shown in FIG. 10). A non-limiting purpose of growing the epitaxy layer 1026 is to secure the source structures 108 and 110 to the substrate 112. Depending on the type of source structures 108 and 110 implemented, silicon materials used for epitaxy layer 1026 can vary. In some exemplary embodiments, silicon phosphorus (SiP) or boron doped silicon germanium (SiGe) may be used to growth the epitaxy layer 1026. For example, if the source structures 108 and 110 are N-type FinFETs, then silicon phosphorous (SiP) is used for the epitaxy layer 1026. In some embodiments, if the source structures 108 and 110 are P-type FinFETs, then boron doped silicon germanium (SiGe) is used for the epitaxy layer 1026.

In some embodiments, a wrap-around contact layer 1028 is formed around the epitaxy layer 1026. The wrap-around contact layer 1028 comprises sacrificial epitaxy material that can be removed. The sacrificial epitaxy material may be silicon germanium with high (e.g., greater than 60%) concentration of germanium.

Figures 11A, 11B:
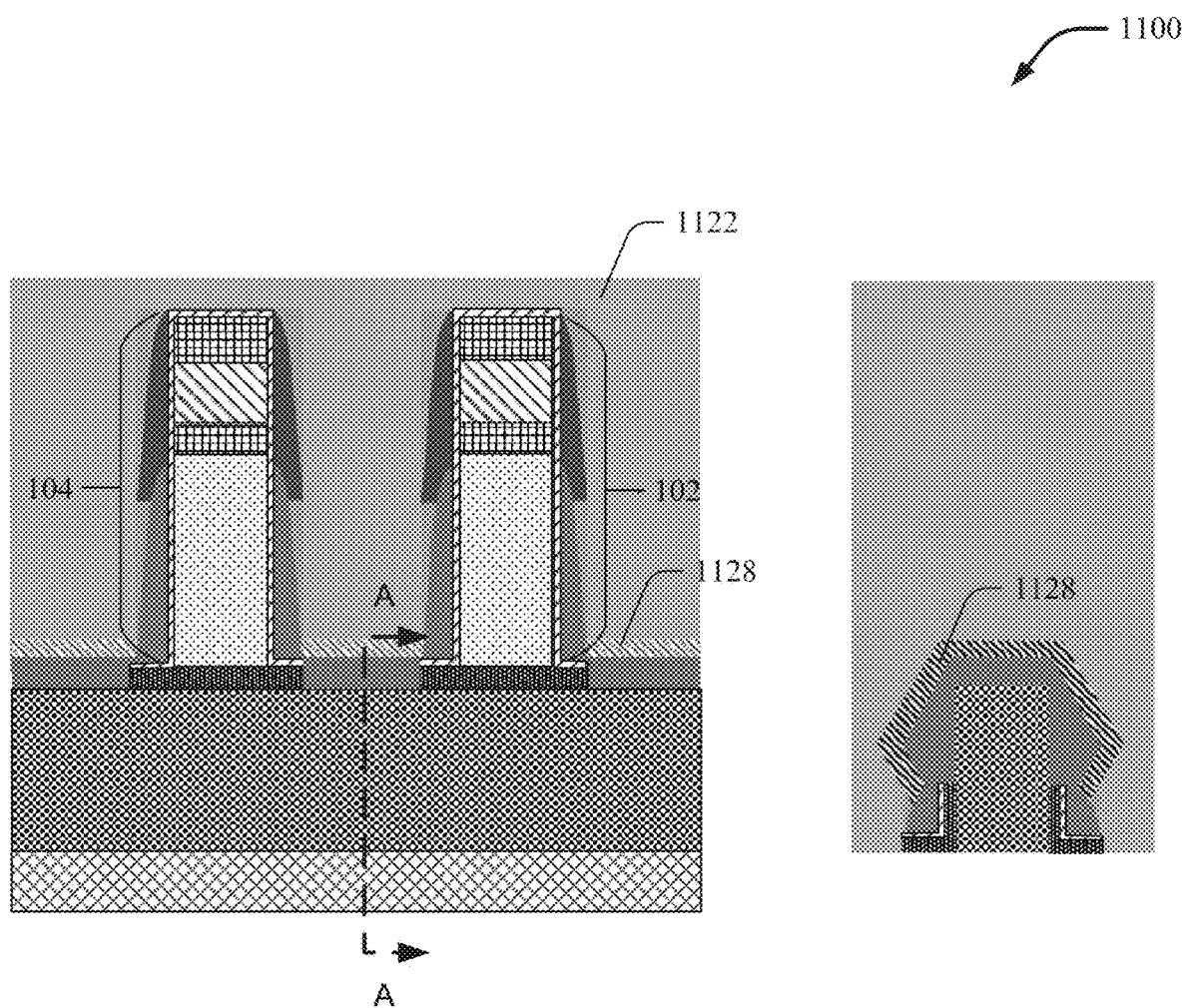
FIG. 11A illustrate example, non-limiting cross-sectional views of a step in fabricating a semiconductor device with a two-part spacer in accordance with one or more embodiments is described herein.
FIG. 11B illustrate example, non-limiting cross-sectional views of a step in fabricating a semiconductor device with a two-part spacer in accordance with one or more embodiments is described herein.

Referring now to FIGS. 11A and 11B, a cross-sectional view of a step in fabricating a semiconductor device 1100 with two-part spacer in accordance with one or more embodiments is described herein. Repetitive description and label of like elements employed in respective embodiments are omitted for sake of brevity. According to one or more embodiments, a gap fill layer 1122 is deposited over the wrap-around layer 1028 and covering the gate structure 102 and 104. Formation of the gap fill layer 1122 may include deposition of sacrificial material. The sacrificial material may then be planarized by chemical mechanical planarization (CMP). In an embodiment, the sacrificial material may be oxide, amorphous silicon (a-Si), silicon (Si), epitaxy material or other suitable dielectric material.

Figures 12A, 12B:
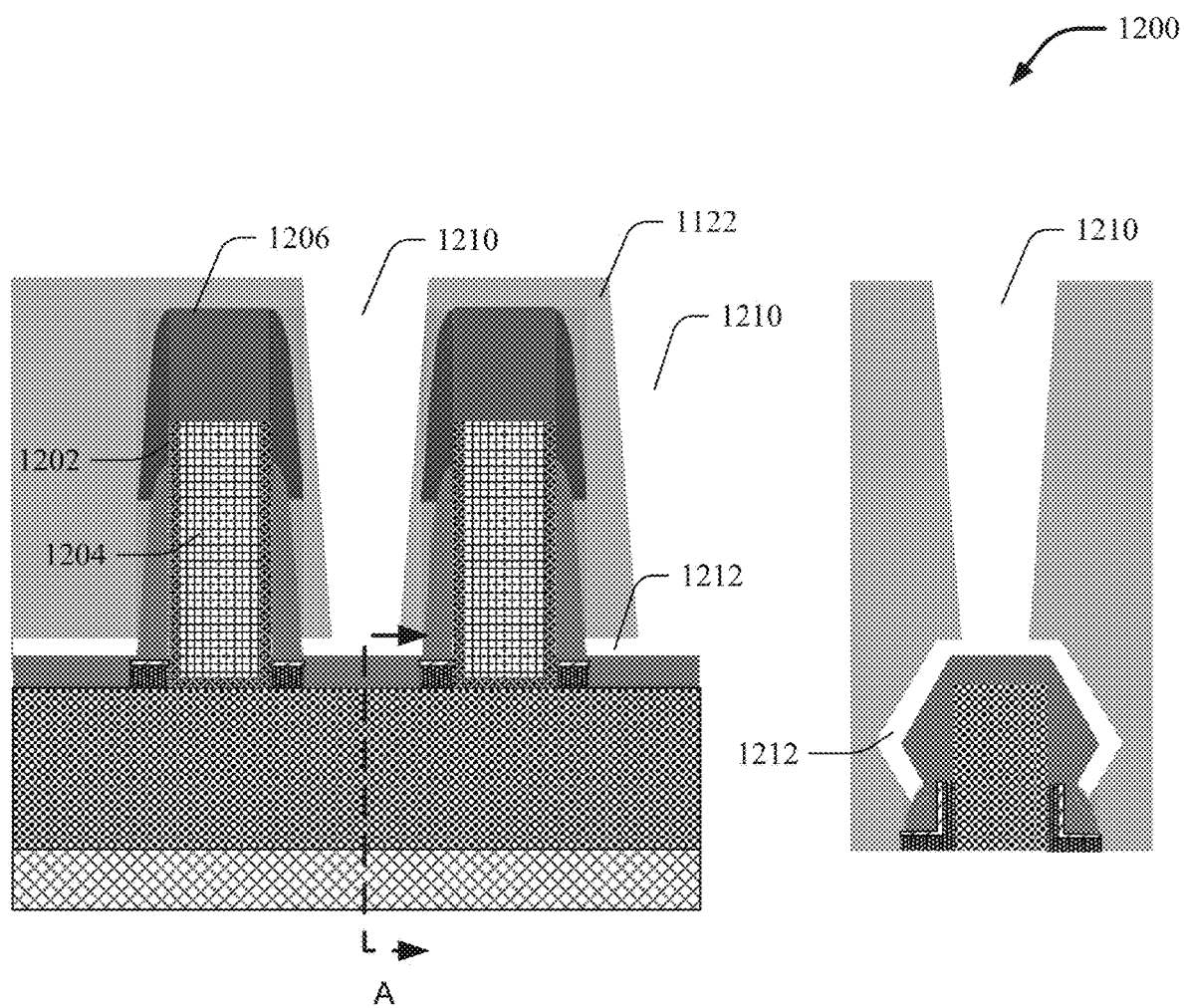
FIG. 12A illustrate example, non-limiting cross-sectional views of a step in fabricating a semiconductor device with a two-part spacer in accordance with one or more embodiments is described herein.
FIG. 12B illustrate example, non-limiting cross-sectional views of a step in fabricating a semiconductor device with a two-part spacer in accordance with one or more embodiments is described herein.

Referring now to FIGS. 12A and 12B, a cross-sectional view of a step in fabricating a semiconductor device 1200 with two-part spacer in accordance with one or more embodiments is described herein. Repetitive description and label of like elements employed in respective embodiments are omitted for sake of brevity. According to one or more embodiments, the gate structure 102 and 104 are removed and replaced with permanent metal material. The gate structures 102 and 104 are removed by etching out the polysilicon contact portion 210, a first silicon dioxide portion 208, a silicon nitride portion 206 and a second silicon dioxide portion 204 of the gate structures 102 and 104 (shown in FIG. 2). In some embodiments, after removing gate structures 102 and 104, a metal gate liner 1202 is formed. The metal gate liner 1202 is a thin layer made of hafnium dioxide material. In some embodiments, a metal gate 1204 is deposited over the metal gate liner 1202 and capped using a cap 1206. The cap 1206 is self-aligned and comprises sacrificial material such as silicon nitrate.

In one or more embodiments, a recess 1210 is created by removing a portion of the gap fill layer 1122 using the RIE process. A recess 1212 is created by removing the wrap-around contact layer 1028. The recesses 1210 and 1212 are formed in preparation for depositing different wrap-around material and attaching metal gates as described below.

Figures 13A, 13B:
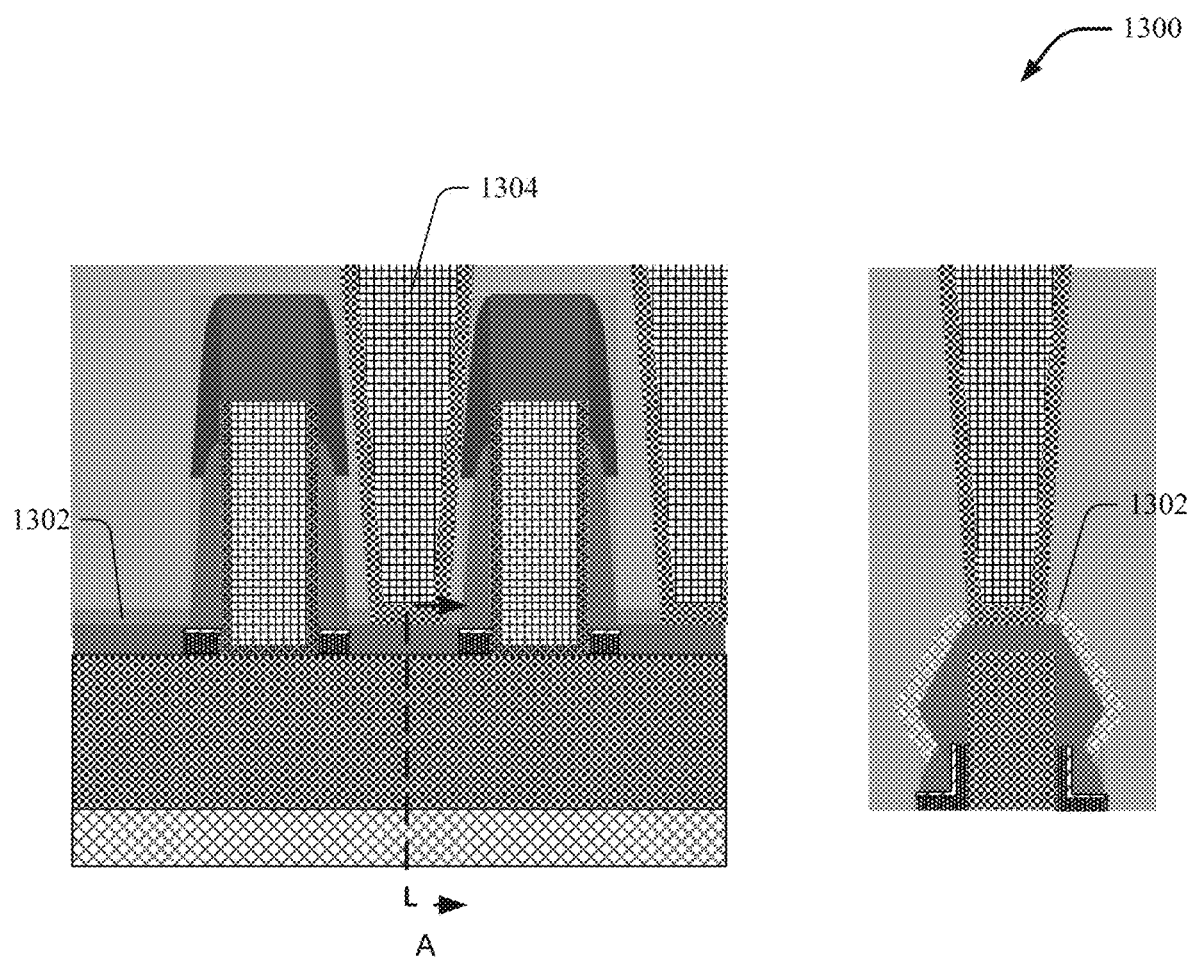
FIG. 13A illustrate example, non-limiting cross-sectional views of a step in fabricating a semiconductor device with a two-part spacer in accordance with one or more embodiments is described herein.
FIG. 13B illustrate example, non-limiting cross-sectional views of a step in fabricating a semiconductor device with a two-part spacer in accordance with one or more embodiments is described herein.

Referring now to FIGS. 13A and 13B, a cross-sectional view of a step in fabricating a semiconductor device 1300 with two-part spacer in accordance with one or more embodiments is described herein. Repetitive description and label of like elements employed in respective embodiments are omitted for sake of brevity. According to one or more embodiments, a wrap-around contact liner 1302 is formed in the recesses 1210 and 1212. The wrap-around contact liner 1302 may comprise titanium, titanium nitride, or tantalum nitride material. In one more embodiments, metal gates are connected to the wrap-around contact liner 1302. The metal gates may comprise cobalt or tungsten material.

Figure 14:
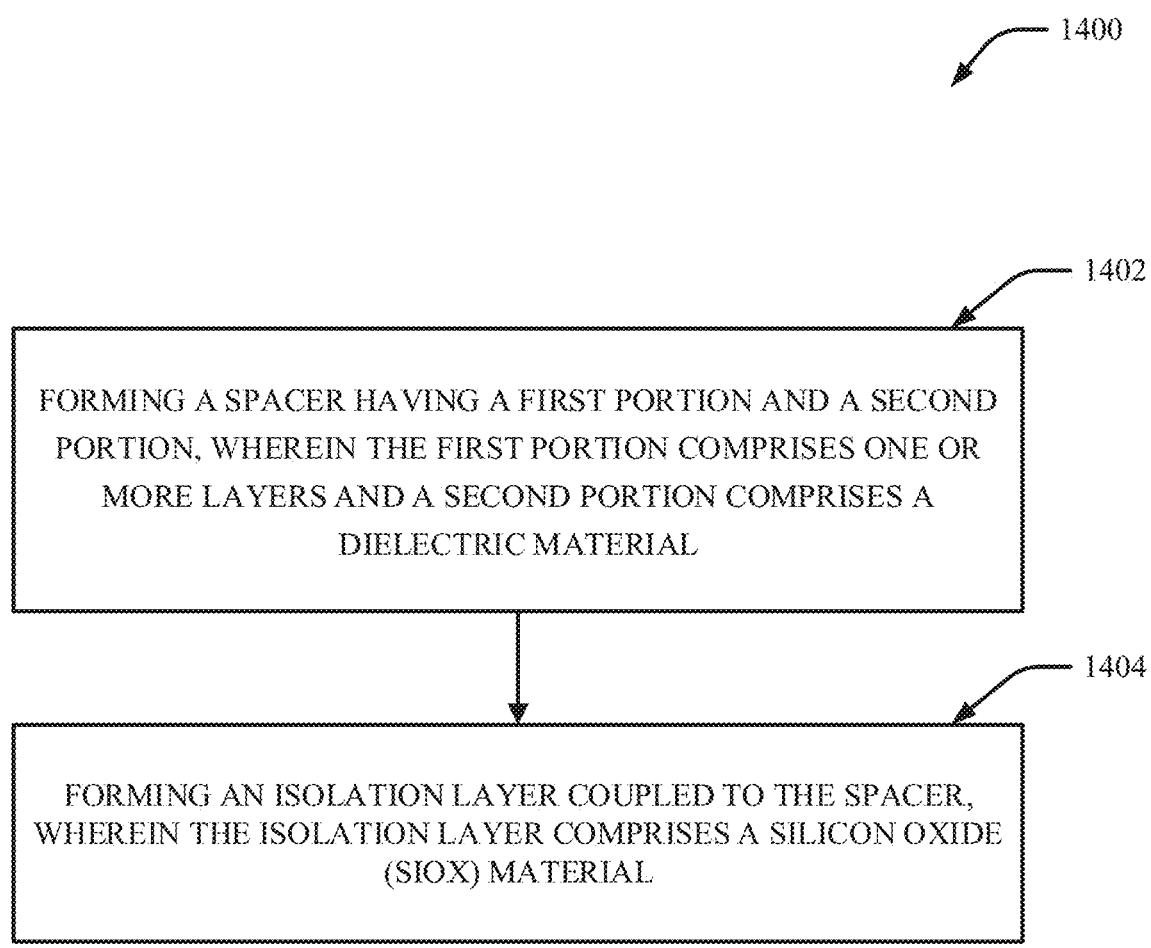
FIG. 14 illustrates a flow diagram of an example, non-limiting computer-implemented method that facilitates fabrication of a semiconductor device with two-part spacer in accordance with one or more embodiments described herein.

Referring now to FIG. 14, a block/flow diagram of a method of fabricating a semiconductor device 1300 with two-part spacer in accordance with one or more embodiments is described herein. The method steps described below do not form a complete process flow for manufacturing semiconductor devices or integrated circuits. The present embodiments can be practiced in conjunction with the integrated circuit fabrication techniques currently used in the art, and only so much of the commonly practiced process steps are included as are necessary for an understanding of the described embodiments.

FIG. 14 illustrates a flow diagram of an example, non-limiting computer-implemented method that facilitates fabrication of a semiconductor device 100 with two-part spacer in accordance with one or more embodiments described herein. In some examples, flow diagram 1400 can be implemented by operating environment 1600. It can be appreciated that the operations of flow diagram 1400 can be implemented in a different order than is depicted. It can also be appreciated that the operations of flow diagram 1400 can be implemented in a different order than is depicted.

In non-limiting example embodiments, a computing device (or system) (e.g., computer 1612) is provided comprising one or more processors and one or more memories that stores executable instructions that, when executed by the one or more processors, can facilitate performance of the operations as described herein, including the non-limiting methods as illustrated in the flow diagrams of FIG. 14. As a non-limiting example, the one or more processors can facilitate performance of the methods by directing or controlling one or more equipment operable to perform semiconductor fabrication.

Operation 1402 depicts forming (e.g., by computer 1612) a spacer (e.g., 904, FIG. 9A) having a first portion and a second portion (e.g., 420a and 820a, FIG. 9A), wherein the first portion comprises one or more layers and a second portion comprises a dielectric material. Operation 1404 depicts forming an isolation layer (e.g., 212, FIG. 2) coupled to the spacer, wherein the isolation layer comprises a silicon oxide material.

Figure 15:
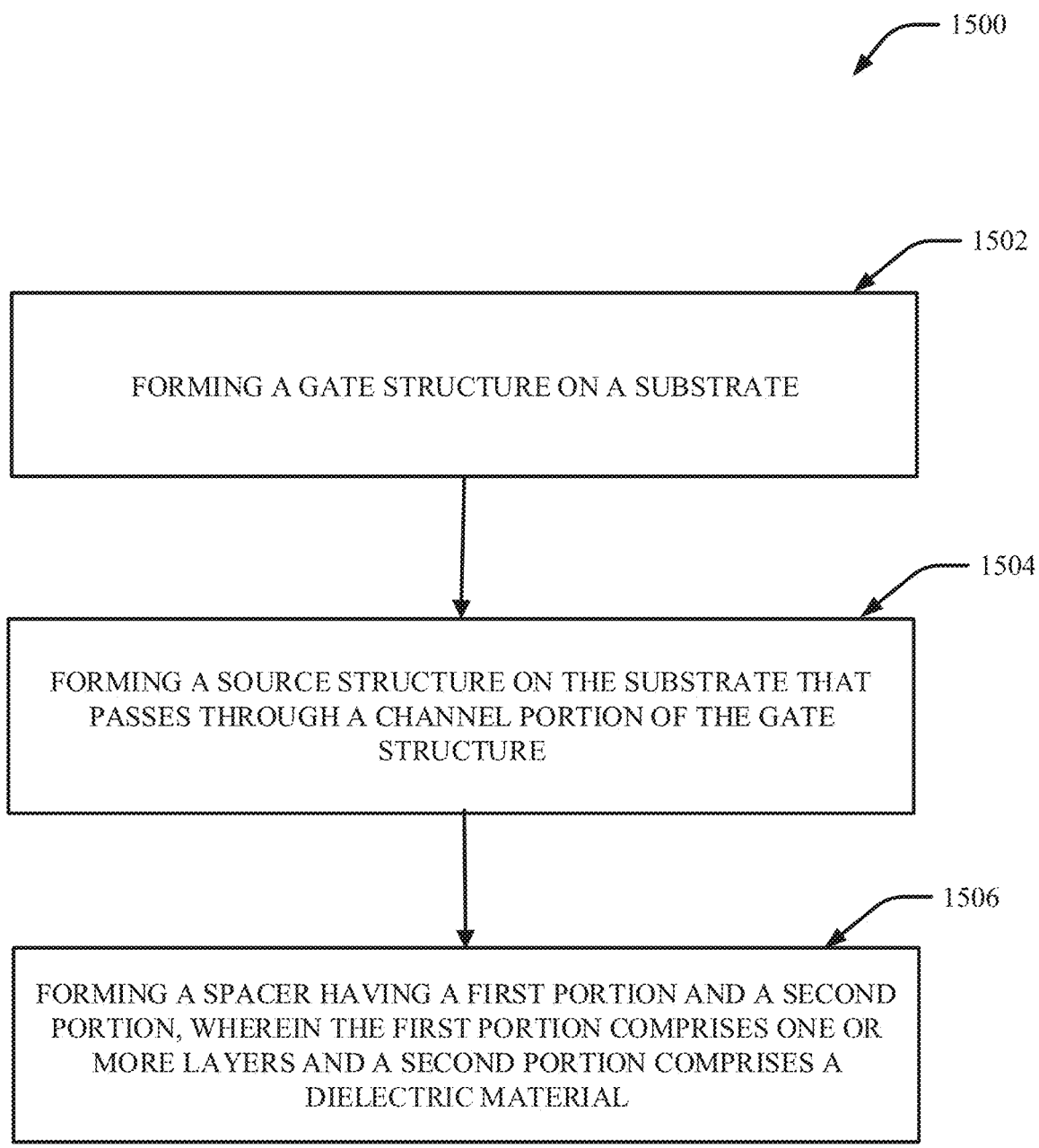
FIG. 15 illustrates a flow diagram of an example, non-limiting computer-implemented method that facilitates fabrication of a semiconductor device with two-part spacer in accordance with one or more embodiments described herein.

FIG. 15 illustrates a flow diagram of an example, non-limiting computer-implemented method that facilitates fabrication of a semiconductor device 100 with two-part spacer in accordance with one or more embodiments described herein. In some examples, flow diagram 1500 can be implemented by operating environment 1600. It can be appreciated that the operations of flow diagram 1500 can be implemented in a different order than is depicted. It can also be appreciated that the operations of flow diagram 1500 can be implemented in a different order than is depicted.

In non-limiting example embodiments, a computing device (or system) (e.g., computer 1612) is provided comprising one or more processors and one or more memories that stores executable instructions that, when executed by the one or more processors, can facilitate performance of the operations as described herein, including the non-limiting methods as illustrated in the flow diagrams of FIG. 15. As a non-limiting example, the one or more processors can facilitate performance of the methods by directing or controlling one or more equipment operable to perform semiconductor fabrication.

Operation 1502 depicts forming (e.g., by computer 1612) a gate structure on a substrate (e.g., 102 FIG. 1). Operation 1504 depicts forming a source structure (e.g., 108, FIG. 1) on the substrate (e.g., 112 FIG. 1) that passes through a channel portion (e.g., 106, FIG. 1) of the gate structure. Operation 1506 depicts forming a spacer (e.g., 904a-b, FIG. 9A) having a first portion and a second portion (e.g., 420a and 820a, FIG. 9A), wherein the first portion comprises one or more layers and a second portion comprises a dielectric material.

Figure 16:
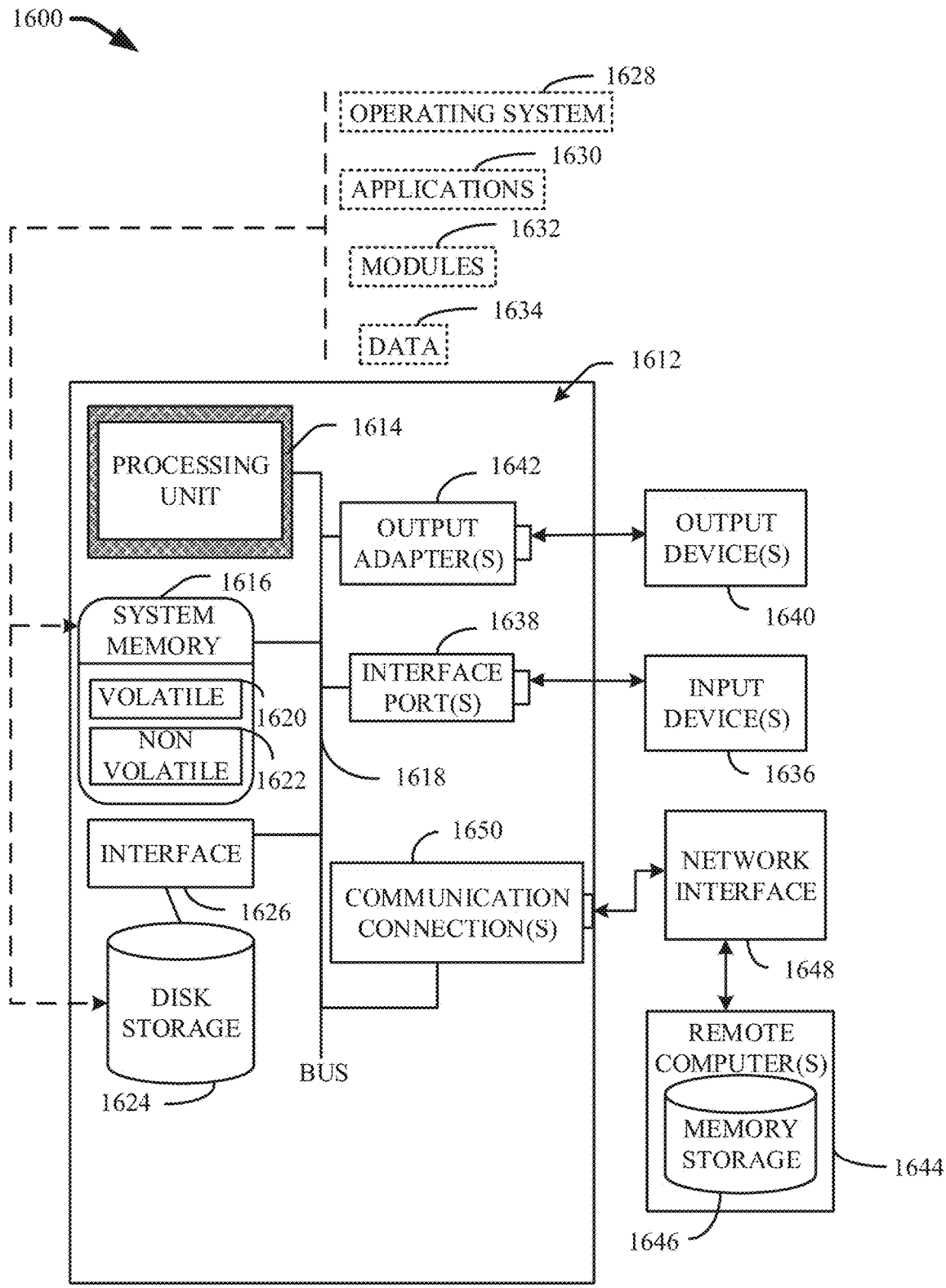
FIG. 16 illustrates a block diagram of an example, non-limiting operating environment in which one or more embodiments is described herein can be facilitated.

To provide context for the various aspects of the disclosed subject matter, FIG. 16 as well as the following discussion are intended to provide a general description of a suitable environment in which the various aspects of the disclosed subject matter can be implemented. FIG. 16 illustrates a block diagram of an example, non-limiting operating environment in which one or more embodiments described herein can be facilitated. Repetitive description of like elements employed in other embodiments described herein is omitted for sake of brevity.

A suitable operating environment 1600 for implementing various aspects of this disclosure can also include a computer 1612. The computer 1612 can also include a processing unit 1614, a system memory 1616, and a system bus 1618. The system bus 1618 couples system components including, but not limited to, the system memory 1616 to the processing unit 1614. The processing unit 1614 can be any of various available processors. Dual microprocessors and other multiprocessor architectures also can be employed as the processing unit 1614. The system bus 1618 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Firewire (IEEE 1694), and Small Computer Systems Interface (SCSI). The system memory 1616 can also include volatile memory 1620 and nonvolatile memory 1622. The basic input/output system (BIOS), containing the basic routines to transfer information between elements within the computer 1612, such as during start-up, is stored in nonvolatile memory 1622. By way of illustration, and not limitation, nonvolatile memory 1622 can include read only memory (ROM), programmable ROM (PROM), electrically programmable ROM (EPROM), electrically erasable programmable ROM (EEPROM), flash memory, or nonvolatile random-access memory (RAM) (e.g., ferroelectric RAM (FeRAM). Volatile memory 1620 can also include random access memory (RAM), which acts as external cache memory. By way of illustration and not limitation, RAM is available in many forms such as static RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM.

Computer 1612 can also include removable/non-removable, volatile/non-volatile computer storage media. FIG. 16 illustrates, for example, a disk storage 1624. Disk storage 1624 can also include, but is not limited to, devices like a magnetic disk drive, floppy disk drive, tape drive, Jaz drive, Zip drive, LS-100 drive, flash memory card, or memory stick. The disk storage 1624 also can include storage media separately or in combination with other storage media including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage 1624 to the system bus 1618, a removable or non-removable interface is typically used, such as interface 1626. FIG. 16 also depicts software that acts as an intermediary between users and the basic computer resources described in the suitable operating environment 1601. Such software can also include, for example, an operating system 1628. Operating system 1628, which can be stored on disk storage 1624, acts to control and allocate resources of the computer 1612. System applications 1630 take advantage of the management of resources by operating system 1628 through program modules 1632 and program data 1634, e.g., stored either in system memory 1616 or on disk storage 1624. It is to be appreciated that this disclosure can be implemented with various operating systems or combinations of operating systems. A user enters commands or information into the computer 1612 through input device(s) 1636. Input devices 1636 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1614 through the system bus 1618 via interface port(s) 1638. Interface port(s) 1638 include, for example, a serial port, a parallel port, a game port, and a universal serial bus (USB). Output device(s) 1640 use some of the same type of ports as input device(s) 1636. Thus, for example, a USB port can be used to provide input to computer 1612, and to output information from computer 1612 to an output device 1640. Output adapter 1642 is provided to illustrate that there are some output devices 1640 like monitors, speakers, and printers, among other output devices 1640, which require special adapters. The output adapters 1642 include, by way of illustration and not limitation, video and sound cards that provide a means of connection between the output device 1640 and the system bus 1618. It should be noted that other devices and/or systems of devices provide both input and output capabilities such as remote computer(s) 1644.

Computer 1612 can operate in a networked environment using logical connections to one or more remote computers, such as remote computer(s) 1644. The remote computer(s) 1644 can be a computer, a server, a router, a network PC, a workstation, a microprocessor based appliance, a peer device or other common network node and the like, and typically can also include many or all the elements described relative to computer 1612. For purposes of brevity, only a memory storage device 1646 is illustrated with remote computer(s) 1644. Remote computer(s) 1644 is logically connected to computer 1612 through a network interface 1648 and then physically connected via communication connection 1650. Network interface 1648 encompasses wire and/or wireless communication networks such as local-area networks (LAN), wide-area networks (WAN), cellular networks, etc. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL). Communication connection(s) 1650 refers to the hardware/software employed to connect the network interface 1648 to the system bus 1618. While communication connection 1650 is shown for illustrative clarity inside computer 1612, it can also be external to computer 1612. The hardware/software for connection to the network interface 1648 can also include, for exemplary purposes only, internal and external technologies such as, modems including regular telephone grade modems, cable modems and DSL modems, ISDN adapters, and Ethernet cards.

Embodiments of the present innovation may be a system, a method, an apparatus and/or a computer program product at any possible technical detail level of integration. The computer program product can include a computer readable storage medium (or media) having computer readable program instructions thereon for causing a processor to carry out aspects of the present innovation. The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium can also include the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device. Computer readable program instructions for carrying out operations of various aspects of the present innovation can be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to customize the electronic circuitry, to perform aspects of the present innovation.

Aspects of the present innovation are described herein with reference to flowchart illustrations and/or block diagrams of methods, apparatus (systems), and computer program products according to embodiments of the innovation. It will be understood that each block of the flowchart illustrations and/or block diagrams, and combinations of blocks in the flowchart illustrations and/or block diagrams, can be implemented by computer readable program instructions. These computer readable program instructions can be provided to a processor of a general-purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks. The computer readable program instructions can also be loaded onto a computer, other programmable data processing apparatus, or other device to cause a series of operational acts to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the figures illustrate the architecture, functionality, and operation of possible implementations of systems, methods, and computer program products according to various embodiments of the present innovation. In this regard, each block in the flowchart or block diagrams can represent a module, segment, or portion of instructions, which comprises one or more executable instructions for implementing the specified logical function(s). In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the subject matter has been described above in the general context of computer-executable instructions of a computer program product that executes on a computer and/or computer, those skilled in the art will recognize that this disclosure also can or can be implemented in combination with other program modules. Generally, program modules include routines, programs, components, data structures, etc. that perform tasks and/or implement abstract data types. Moreover, those skilled in the art will appreciate that the inventive computer-implemented methods can be practiced with other computer system configurations, including single-processor or multiprocessor computer systems, mini-computing devices, mainframe computers, as well as computers, hand-held computing devices (e.g., PDA, phone), microprocessor-based or programmable consumer or industrial electronics, and the like. The illustrated aspects can also be practiced in distributed computing environments where tasks are performed by remote processing devices that are linked through a communications network. However, some, if not all aspects of this disclosure can be practiced on stand-alone computers. In a distributed computing environment, program modules can be located in both local and remote memory storage devices.

As used in this application, the terms "component," "system," "platform," "interface," and the like, can refer to and/or can include a computer-related entity or an entity related to an operational machine with one or more specific functionalities. The entities disclosed herein can be either hardware, a combination of hardware and software, software, or software in execution. For example, a component can be, but is not limited to being, a process running on a processor, a processor, an object, an executable, a thread of execution, a program, and/or a computer. By way of illustration, both an application running on a server and the server can be a component. One or more components can reside within a process and/or thread of execution and a component can be localized on one computer and/or distributed between two or more computers. In another example, respective components can execute from various computer readable media having various data structures stored thereon. The components can communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor. In such a case, the processor can be internal or external to the apparatus and can execute at least a part of the software or firmware application. As yet another example, a component can be an apparatus that provides specific functionality through electronic components without mechanical parts, wherein the electronic components can include a processor or other means to execute software or firmware that confers at least in part the functionality of the electronic components. In an aspect, a component can emulate an electronic component via a virtual machine, e.g., within a server computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

As it is employed in the subject specification, the term "processor" can refer to substantially any computing processing unit or device comprising, but not limited to, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Further, processors can exploit nano-scale architectures such as, but not limited to, molecular and quantum-dot based transistors, switches and gates, in order to optimize space usage or enhance performance of user equipment. A processor can also be implemented as a combination of computing processing units. In this disclosure, terms such as "store," "storage," "data store," data storage," "database," and substantially any other information storage component relevant to operation and functionality of a component are utilized to refer to "memory components," entities embodied in a "memory," or components comprising a memory. It is to be appreciated that memory and/or memory components described herein can be either volatile memory or nonvolatile memory, or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), flash memory, or non-volatile random access memory (RAM) (e.g., ferroelectric RAM (FeRAM). Volatile memory can include RAM, which can act as external cache memory, for example. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM (RDRAM). Additionally, the disclosed memory components of systems or computer-implemented methods herein are intended to include, without being limited to including, these and any other suitable types of memory.

What has been described above include mere examples of systems, computer program products, and computer-implemented methods. It is, of course, not possible to describe every conceivable combination of components, products and/or computer-implemented methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim. The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A device, comprising: a substrate on which a gate structure is formed: a first spacer layer having a first portion and a second portion formed adjacent to the gate structure, wherein the first portion comprises one or more layers and the second portion comprises a dielectric material; an isolation layer coupled to the first spacer layer on a first side of the isolation layer, wherein the isolation layer comprises a silicon oxide material; a drain structure coupled to a second side of the isolation layer, wherein the second side of the isolation layer is opposite the first side of the isolation layer, wherein the gate structure further comprises an etch stop layer formed on the isolation layer and around the gate structure; and a dummy layer disposed over the etch stop layer, and a second spacer layer formed over the dummy layer and around an exposed portion of the gate structure, wherein the second spacer layer is distinct from the first spacer layer.

2. The device of claim 1, wherein the gate structure comprises a polysilicon contact portion, a first silicon dioxide portion, a silicon nitride portion and a second silicon dioxide portion.

3. The device of claim 1, wherein the dielectric material of the second portion of the first spacer layer comprises a composition of silicon boron carbon nitride material.

4. The device of claim 1, wherein the gate structure composed of a material selected from a group consisting of oxide and nitride.

5. The device of claim 1, wherein the first portion of the first spacer layer comprises a first layer that comprises a silicon nitride material.

6. The device of claim 1, wherein the first portion of the first spacer layer comprises a first layer that comprises a silicon nitride material and a second layer that comprises a silicon boron carbon nitride material.

7. The device of claim 1, wherein the first portion of the first spacer layer comprises a first layer that comprises of a first silicon nitride material, a second layer that comprises a silicon boron carbon nitride material and a third layer that comprises of a second silicon nitride material.

8. The device of claim 1, further comprising:
a source structure; and
a wrap-around contact around the source structure.

9. A method, comprising: forming a substrate; providing a gate structure on the substrate; forming a first spacer layer having a first portion and a second portion adjacent to the gate structure, wherein the first portion comprises one or more layers and the second portion comprises a dielectric material; forming an isolation layer coupled to the first spacer layer on a first side of the isolation layer, wherein the isolation layer comprises a silicon oxide material; forming a drain structure coupled to a second side of the isolation layer, wherein the second side of the isolation layer is opposite the first side of the isolation layer; forming an etch stop layer on the isolation layer and around the gate structure; and forming a dummy layer over the etch stop layer, and forming a second spacer layer over the dummy layer and around an exposed portion of the gate structure, wherein the second spacer layer is distinct from the first spacer layer.

10. The method of claim 9, wherein the gate structure comprises a polysilicon contact portion, a first silicon dioxide portion, a silicon nitride portion and a second silicon dioxide portion.

11. The method of claim 9, wherein the dielectric material of the second portion of the first spacer layer comprises a composition of silicon boron carbon nitride material.

12. The method of claim 9, wherein the gate structure is composed of a material selected from a group consisting of oxide and nitride.

13. The method of claim 9, wherein the first portion of the first spacer layer comprises a first layer that comprises a silicon nitride material.

14. The method of claim 9, wherein the first portion of the first spacer layer comprises a first layer that comprises a silicon nitride material and a second layer that comprises a silicon boron carbon nitride material.

15. The method of claim 9, wherein the first portion of the first spacer layer comprises a first layer that comprises of a first silicon nitride material, a second layer that comprises a silicon boron carbon nitride material and a third layer that comprises of a second silicon nitride material.

16. The method of claim 9, further comprising:
forming a source structure; and
forming a wrap-around contact around the source structure.

17. A method, comprising: forming a gate structure on a substrate; forming a source structure on the substrate that passes through a channel portion of the gate structure; forming a first spacer layer comprises a first portion and a second portion adjacent to the gate structure, wherein the first portion comprises one or more layers and the second portion comprises a dielectric material; forming an isolation layer coupled to the first spacer layer on a first side of the isolation layer; forming a drain structure on a second side of the isolation layer, wherein the second side is opposite the first side; forming an etch stop layer on the isolation layer and around the gate structure; and forming a dummy layer over the etch stop layer, and forming a second spacer layer over the dummy layer and around an exposed portion of the gate structure, wherein the second spacer layer is distinct from the first spacer layer.

18. The method of claim 17,
wherein the isolation layer comprises a silicon oxide material and wherein the first portion of the first spacer layer comprises a first layer that comprises a silicon nitride material and a second layer that comprises a silicon boron carbon nitride material.

19. The method of claim 17, wherein the source structure comprises a fin field effect transistor.

20. The method of claim 17, wherein the source structure comprises a transistor made from plurality of nanosheets.

\* \* \* \* \*